United States Patent
Wang et al.

(10) Patent No.: US 11,474,789 B2
(45) Date of Patent: Oct. 18, 2022

(54) POWER SUPPLIER CIRCUIT AND OPERATION METHOD

(71) Applicant: Realtek Semiconductor Corporation, Hsinchu (TW)

(72) Inventors: Shih-Cheng Wang, Taichung (TW); Chun-Yu Luo, Taoyuan (TW); Shih-Chieh Chen, Yilan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 248 days.

(21) Appl. No.: 16/823,626

(22) Filed: Mar. 19, 2020

(65) Prior Publication Data

US 2021/0103430 A1   Apr. 8, 2021

(30) Foreign Application Priority Data

Oct. 4, 2019   (TW) .................................. 108136114

(51) Int. Cl.
| | | |
|---|---|---|
| *G06F 7/58* | (2006.01) | |
| *G10L 19/00* | (2013.01) | |
| *H03K 17/687* | (2006.01) | |
| *H03K 3/84* | (2006.01) | |
| *H03K 4/06* | (2006.01) | |
| *H04R 3/00* | (2006.01) | |

(52) U.S. Cl.
CPC .............. *G06F 7/582* (2013.01); *G10L 19/00* (2013.01); *H03K 3/84* (2013.01); *H03K 4/06* (2013.01); *H03K 17/6872* (2013.01); *H04R 3/00* (2013.01)

(58) Field of Classification Search
CPC ............... H03F 1/305; H03F 2200/351; H03F 2200/372; H03F 1/26; H04R 1/1041; H04R 3/04
USPC ................................... 381/94.8, 94.5; 700/94
See application file for complete search history.

(56) References Cited

U.S. PATENT DOCUMENTS

| | | | | |
|---|---|---|---|---|
| 9,929,650 | B1 * | 3/2018 | Kirchner | ............... H02M 3/156 |
| 2008/0136395 | A1 | 6/2008 | Bennett | |
| 2012/0244916 | A1 * | 9/2012 | Brown | ................... H02M 3/158 |
| | | | | 455/571 |
| 2013/0249505 | A1 * | 9/2013 | Brown | ...................... G05F 3/08 |
| | | | | 323/223 |
| 2017/0117730 | A1 * | 4/2017 | Kim | ......................... H02J 7/00 |
| 2021/0135593 | A1 * | 5/2021 | Feng | ....................... H04L 67/12 |

FOREIGN PATENT DOCUMENTS

| | | | | |
|---|---|---|---|---|
| CN | 101199132 A | | 6/2008 | |
| CN | 101610037 A | | 12/2009 | |
| GB | 2437350 A | * | 10/2007 | ............. H04L 27/32 |
| JP | 2005033534 A | | 2/2005 | |

* cited by examiner

*Primary Examiner* — Alexander Krzystan
(74) *Attorney, Agent, or Firm* — Locke Lord LLP; Tim Tingkang Xia, Esq.

(57) ABSTRACT

A power supplier circuit supplies a power signal to a codec of an audio apparatus. The power supplier circuit includes a random sequence generation circuit, a control circuit, and a power circuit. The random sequence generation circuit generates a random sequence. The control circuit outputs a first control signal according to the random sequence, a first reference signal, and the power signal. The power circuit generates the power signal according to the first control signal, such that the power signal is spread in response to the random sequence.

18 Claims, 7 Drawing Sheets

POWER SUPPLIER CIRCUIT AND OPERATION METHOD

RELATED APPLICATIONS

This application claims priority to Taiwanese Application Serial Number 108136114, filed Oct. 4, 2019, which is herein incorporated by reference.

BACKGROUND

Technical Field

The present disclosure relates to a circuit technology. More particularly, the present disclosure relates to a power supplier circuit and an operation method.

Description of Related Art

When an audio apparatus operates in a power-saving mode, a power supplier system of the audio apparatus often adopts pulse frequency modulation (PFM) to reduce power consumption. However, power of the audio apparatus is also varied, and noise spur of the power supplier system would be introduced into the audio apparatus together with the pulse, resulting in discomfort to ears.

SUMMARY

One embodiment of the present disclosure is related to a power supplier circuit. The power supplier circuit is configured to supply a power signal to a codec of an audio apparatus. The power supplier circuit includes a random number sequence generator circuit, a control circuit, and a power circuit. The random number sequence generator circuit is configured to generate a random number sequence. The control circuit is configured to output a first control signal according to the random number sequence, a first reference signal, and the power signal. The power circuit is configured to generate the power signal according to the first control signal, such that a spectrum of the power signal is spread in response to the random number sequence.

One embodiment of the present disclosure is related to an operation method of a power supplier circuit. The power supplier circuit is configured to supply a power signal to a codec of an audio apparatus. The operation method includes: generating a random number sequence by a random number sequence generator circuit; outputting a first control signal by a control signal according to the random number sequence, a first reference signal, and the power signal; and generating the power signal by a power circuit according to the first control signal, such that a spectrum of the power signal is spread in response to the random number sequence.

As the above embodiments, the power supplier circuit and the operation method of the present disclosure can reduce discomfort to ears resulted from the power signal of the audio apparatus.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
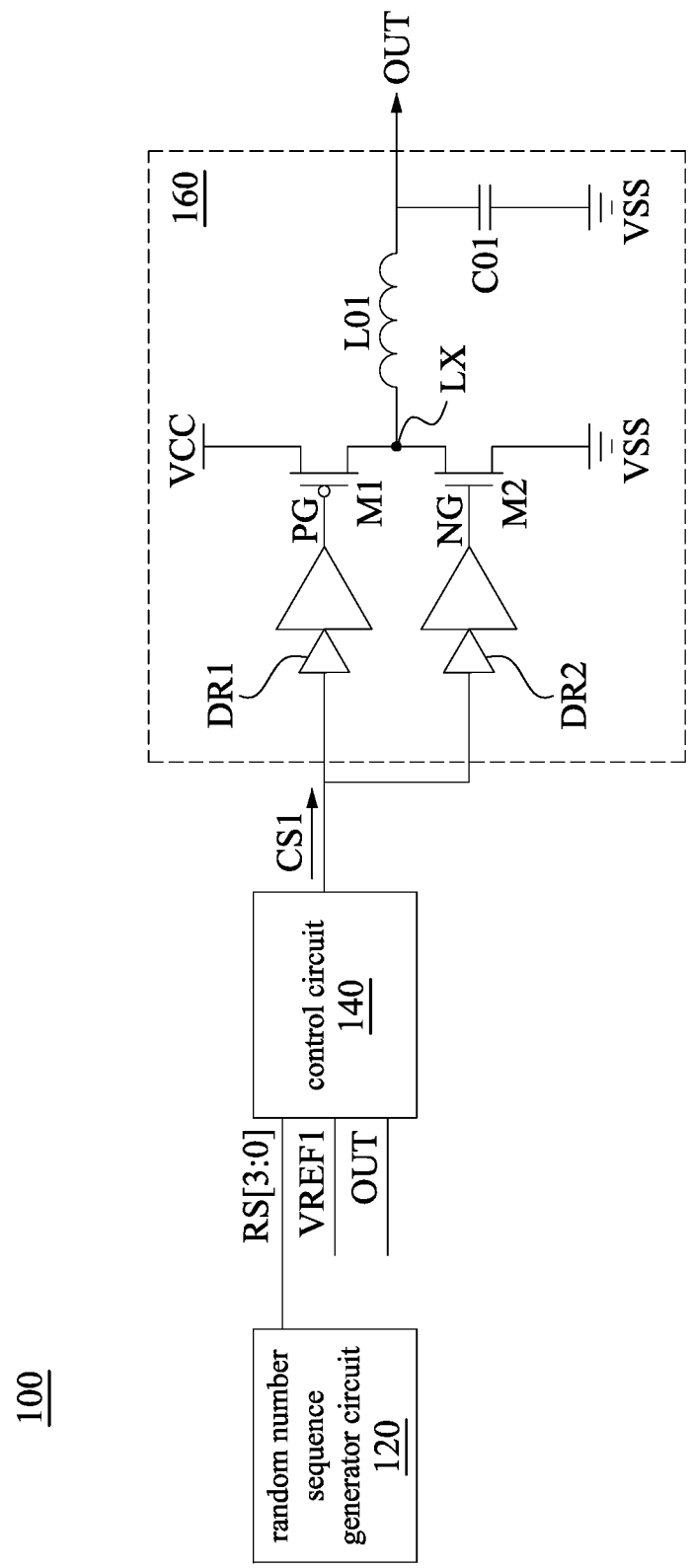
FIG. 1 is a schematic diagram illustrating a power supplier circuit according to some embodiments of the present disclosure.

Reference is made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may refer to "electrically connected" or "electrically coupled." "Connected" or "coupled" may also refer to operations or actions between two or more elements.

Reference is made to FIG. 1. FIG. 1 is a schematic diagram illustrating a power supplier circuit 100 according to some embodiments of the present disclosure. In some embodiments, the power supplier circuit 100 is applied to an audio apparatus. For example, the audio apparatus includes the power supplier circuit 100, a codec, and other circuits. The power supplier circuit 100, the codec, and other circuits operate to generate audio signals. The power supplier circuit 100 is configured to provide a power signal OUT to the codec.

As illustrated in FIG. 1, the power supplier circuit 100 includes a random number sequence generator circuit 120, a control circuit 140, and a power circuit 160. The control circuit 140 is coupled to the random number sequence generator circuit 120. The power circuit 160 is coupled to the control circuit 140.

The random number sequence generator circuit 120 is configured to generate a random number sequence RS[3:0]. In this example, a quantity of bits of the random number sequence RS[3:0] is only for illustration, various quantities are within scopes of the present disclosure. The control circuit 140 is configured to receive the random number sequence RS[3:0], a reference signal VREF1, and a feed-backed power signal OUT, to generate a control signal CS1 according to the random number sequence RS[3:0], the reference signal VREF1, and the power signal OUT. Accordingly, duty cycles of the control signal CS1 are in response to the random number sequence RS[3:0]. The power circuit 160 is configured to receive the control signal CS1, to generate the power signal OUT according to the control signal CS1.

As illustrated in FIG. 1, the power circuit 160 includes a driver DR1, a driver DR2, a transistor M1, a transistor M2, an inductor L01, and a capacitor C01. The transistor M1 is configured to receive a power voltage VDD. The transistor M1 is coupled in series to the transistor M2. In this example, the transistor M1 is implemented by a P-type transistor and the transistor M2 is implemented by N-type transistor.

When the control signal CS1 has a low voltage level (for example: a logical value 0), the driver DR1 outputs a driving signal PG having a low voltage level to a control terminal of the transistor M1 according to the control signal CS1. The driver DR2 outputs a driving signal NG having a low voltage level to a control terminal of the transistor M2 according to the control signal CS1. In this condition, the transistor M1 is turned on and the transistor M2 is turned off. A voltage level at a node LX is pulled up based on the power voltage VDD. Accordingly, the voltage signal at the node LX is outputted through a filter circuit formed by the inductor L01 and the capacitor C01, such that the power signal OUT is pulled up in response to the voltage signal at the node LX.

When the control signal CS1 has a high voltage level (for example a logical value 1), the driver DR1 outputs a driving signal PG having a high voltage level to the control terminal of the transistor M1 according to the control signal CS1. The driver DR2 outputs a driving signal NG having a high voltage level to the control terminal of the transistor M2 according to the control signal CS1. In this condition, the transistor M1 is turned off, and the transistor M2 is turned on. A voltage level at a node LX is pulled down based on a ground voltage VSS. Accordingly, the voltage signal at the node LX is outputted through the filter circuit formed by the inductor L01 and the capacitor C01, such that the power signal OUT is pulled down in response to the voltage signal at the node LX.

As described above, the duty cycle of the control signal CS1 is in response to the random number sequence RS[3:0]. Accordingly, the duty cycle of the power signal OUT generated according to the control signal CS1 is also in response to the random number sequence RS[3:0]. Effectively, a spectrum of the power signal OUT is viewed as to be a spread spectrum.

With configurations of the power supplier circuit 100, the spectrum of the power signal OUT supplied to the codec of the audio apparatus is spread. Accordingly, power of the power signal OUT can be spread to a lager frequency range, such that power at each frequency is reduced. Thus, discomfort to ears resulted from the power signal of the audio apparatus can be relieved.

Figures 2A, 2B:
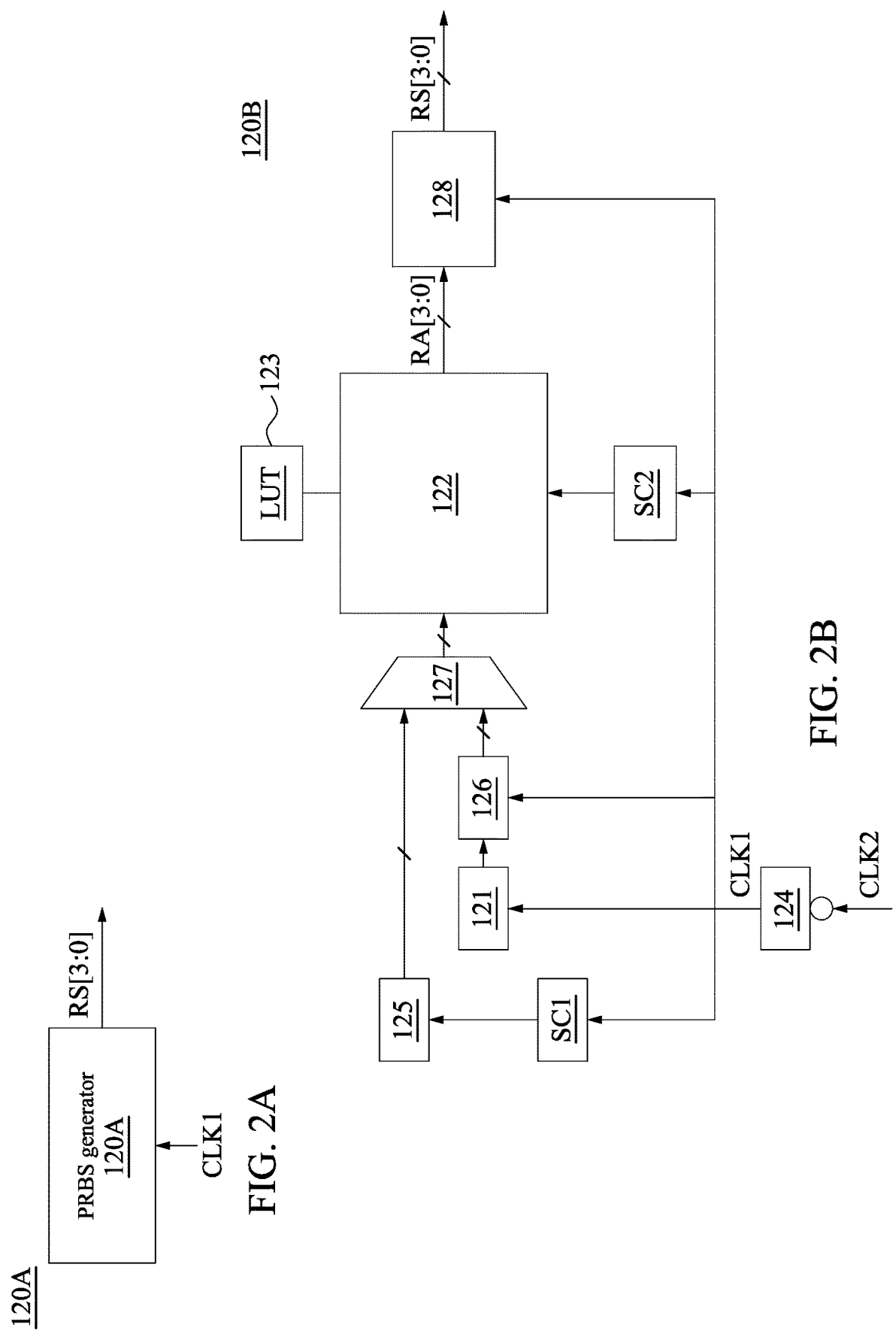
FIG. 2A is a schematic diagram illustrating a random number sequence generator circuit according to some embodiments of the present disclosure.
FIG. 2B is a schematic diagram illustrating a random number sequence generator circuit according to some embodiments of the present disclosure.

Reference is made to FIG. 2A. FIG. 2A is schematic diagram illustrating a random number sequence generator circuit 120A according to some embodiments of the present disclosure. In some embodiments, the random number sequence generator circuit 120A is applied to the random number sequence generator circuit 120 in FIG. 1, but the present disclosure is not limited thereto. As illustrated in FIG. 2A, the random number sequence generator circuit 120A is Pseudo Randomness Binary Sequence (PRBS) generator. The random number sequence generator circuit 120A generates a PRBS sequence according to a clock signal CLK1, to be the random number sequence RS[3:0].

Reference is made to FIG. 2B. FIG. 2B is schematic diagram illustrating a random number sequence generator circuit 120B according to some embodiments of the present disclosure. In some embodiments, the random number sequence generator circuit 120B is applied to the random number sequence generator circuit 120 in FIG. 1, but the present disclosure is not limited thereto. As illustrated in FIG. 2B, the random number sequence generator circuit 120B includes a PRBS generator 121, a processor 122, a memory 123, a frequency divider 124, a triangle wave generator 125, a series-to-parallel circuit 126, a multiplexer 127, a filter 128, and speed controllers SC1-SC2. A look-up table LUT is stored in the memory 123. The look-up table LUT includes conversion information.

The frequency divider 124 is configured to generate the clock signal CLK1 according to a clock signal CLK2, to control a speed of generating a PRBS by the PRBS generator 121. The series-to-parallel circuit 126 is configured to convert the PRBS in series to in parallel according to the dock signal CLK1. The triangle wave generator 125 is configured to generate a triangular wave signal. The speed controller SC1 is configured to control a speed of generating the triangular wave signal by the triangle wave generator 125 according to the clock signal CLK1. The multiplexer 127 outputs the triangle wave signal from the triangle wave generator 125 or the PRBS in parallel from the series-to-parallel circuit 126 according to a selection signal (not shown). Then, the processor 122 utilizes the look-up table LUT in the memory 123 to convert the triangle wave signal from the multiplexer 127 or the PRBS in parallel from the multiplexer 127 to be a redistribution signal RA[3:0].

In some embodiments, the triangular wave signal and the PRBS in parallel have the same bit length.

Operations of utilizing the look-up table LUT to generate the redistribution signal RA[3:0] by the processor 122 are described below. For example, the look-up table LUT records that "000000" corresponds to "0001", "000001" corresponds to "0101", "000010" corresponds to "0010" . . . etc. In this condition, RA[3:0] corresponds to "0001" when the triangle wave signal from the multiplexer 127 or the PRBS in a parallel form from the multiplexer 127 has six bits, and when the six bits correspond to "000000". RA[3:0] corresponds to "0101" when the triangle wave signal from the multiplexer 127 or the PRBS in parallel from the multiplexer 127 has six bits and the six bits correspond to "000001". RA[3:0] corresponds to "0010" when the triangle wave signal from the multiplexer 127 or the PRBS in parallel from the multiplexer 127 has six bits and the six bits correspond to "000010".

The speed controller SC2 is configured to control a processing speed of the processor 122 according to the clock signal CLK1. The filter 128 performs a filtering process to the redistribution signal RA[3:0] according to the clock signal CLK1, and then generates the random number sequence RS[3:0]. In some embodiments, the filter 128 may be implemented by a low pass filter (LPF).

Figure 2C:
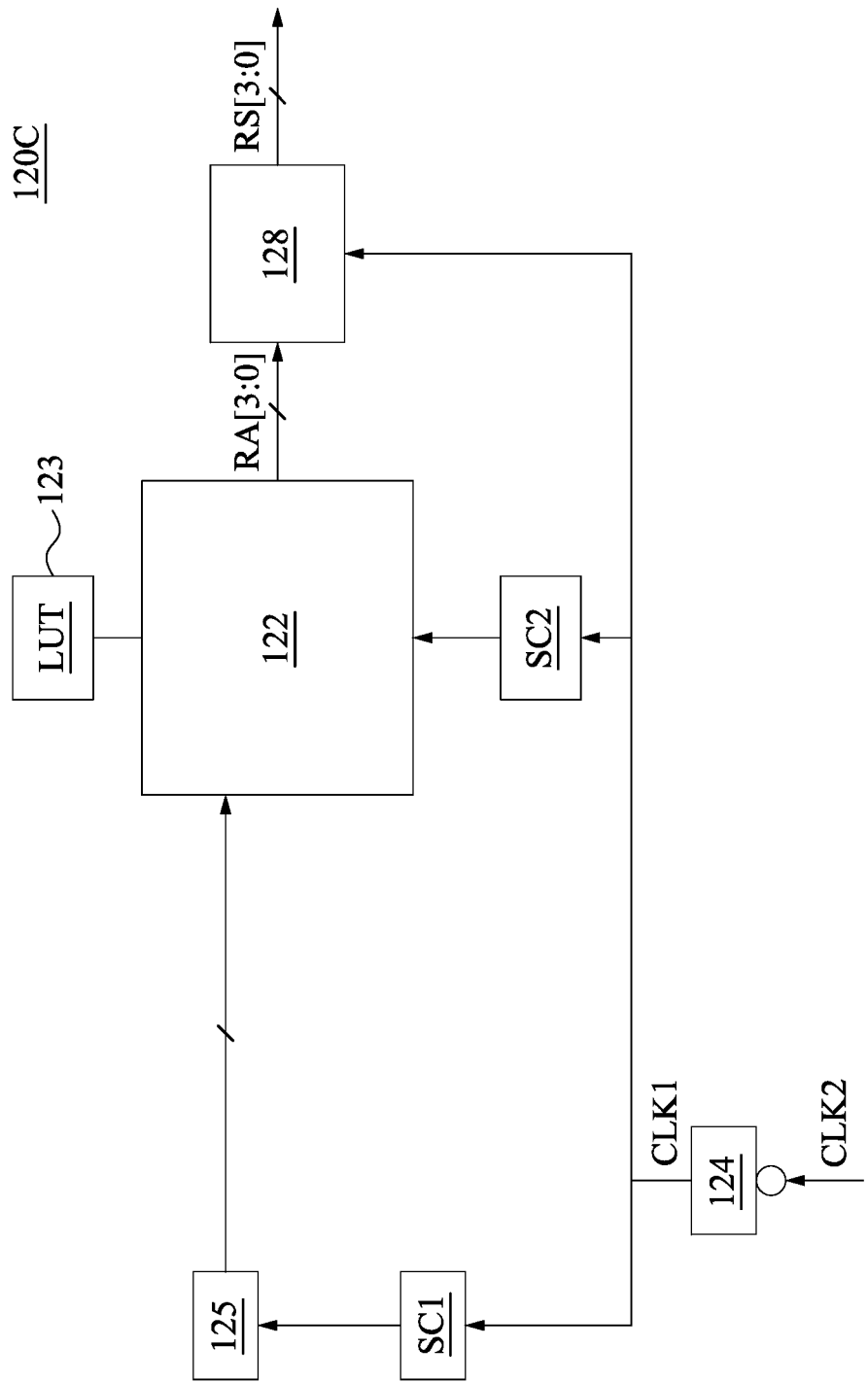
FIG. 2C is a schematic diagram illustrating a random number sequence generator circuit according to some embodiments of the present disclosure.

Reference is made to FIG. 2C. FIG. 2C is schematic diagram illustrating a random number sequence generator circuit 120C according to some embodiments of the present disclosure. In some embodiments, the random number sequence generator circuit 120C is applied to the random number sequence generator circuit 120 in FIG. 1, but the present disclosure is not limited thereto. As illustrated in FIG. 2C, the random number sequence generator circuit 120C merely includes the frequency divider 124, the speed controllers SC1-SC2, the triangle wave generator 125, the processor 122, the memory 123, and the filter 128. In these embodiments, the processor 122 converts a triangle wave signal from the triangle wave generator 125 to be the redistribution signal RA[3:0] based on the conversion information of the look-up table LUT. Other operations are similar to FIG. 2B, so they are not described herein.

Figure 2D:
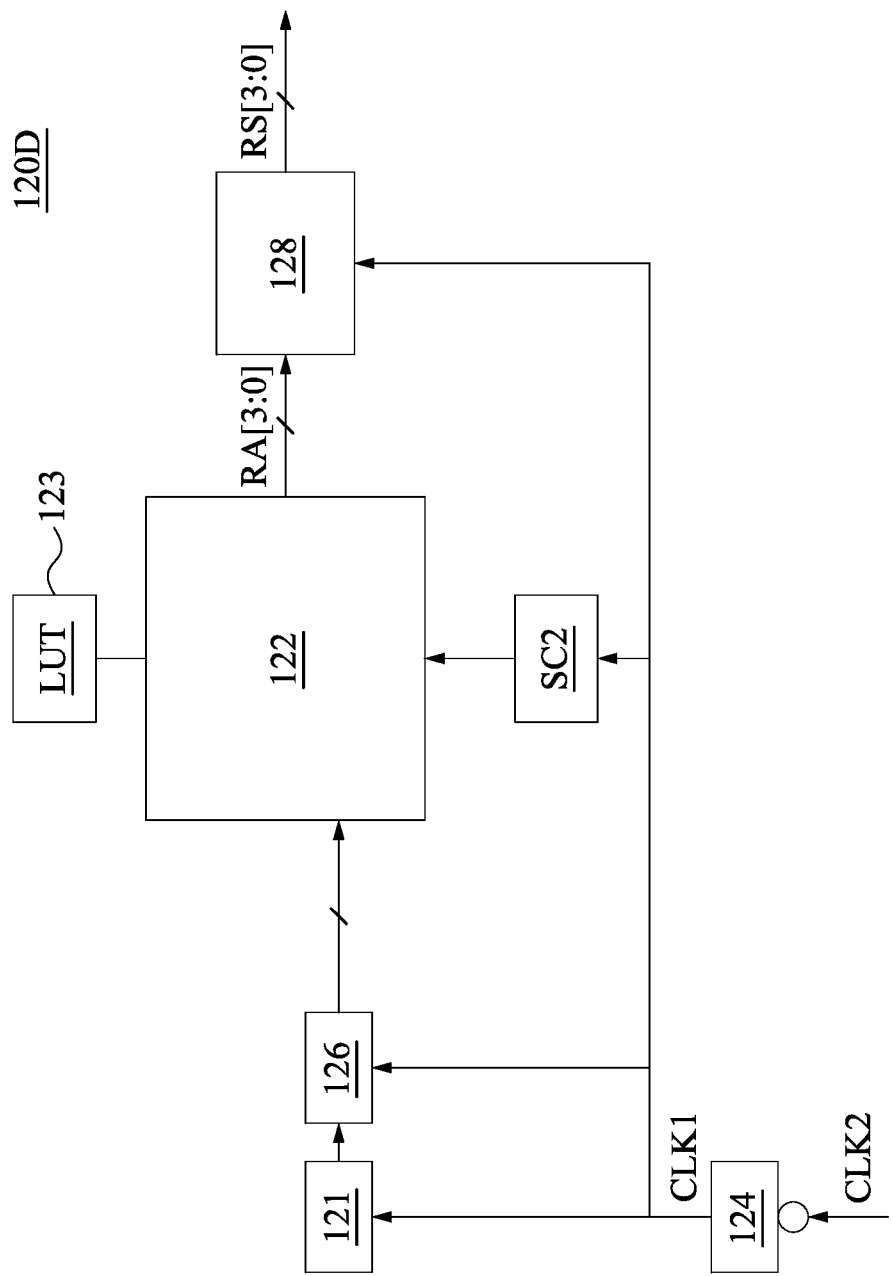
FIG. 2D is a schematic diagram illustrating a random number sequence generator circuit according to some embodiments of the present disclosure.

Reference is made to FIG. 2D. FIG. 2D is a schematic diagram illustrating a random number sequence generator circuit 120D according to some embodiments of the present disclosure. In some embodiments, the random number sequence generator circuit 120D is applied to the random number sequence generator circuit 120 in FIG. 1, but the present disclosure is not limited thereto. As illustrated in FIG. 2D, the random number sequence generator circuit 120D merely includes the frequency divider 124, the PRBS generator 121, the series-to-parallel circuit 126, the processor 122, the memory 123, the filter 128, and the speed controller SC2. In these embodiments, the processor 122 converts the PRBS in parallel from the series-to-parallel circuit 126 to be the redistribution signal RA[3:0] based on the conversion information of the look-up table LUT. Other operations are similar to those in FIG. 2B, so they are not described herein.

In FIG. 2B to FIG. 2D, the look-up table LUT including the conversion information can enhance the randomness of the random number sequence RS[3:0].

Figure 3:
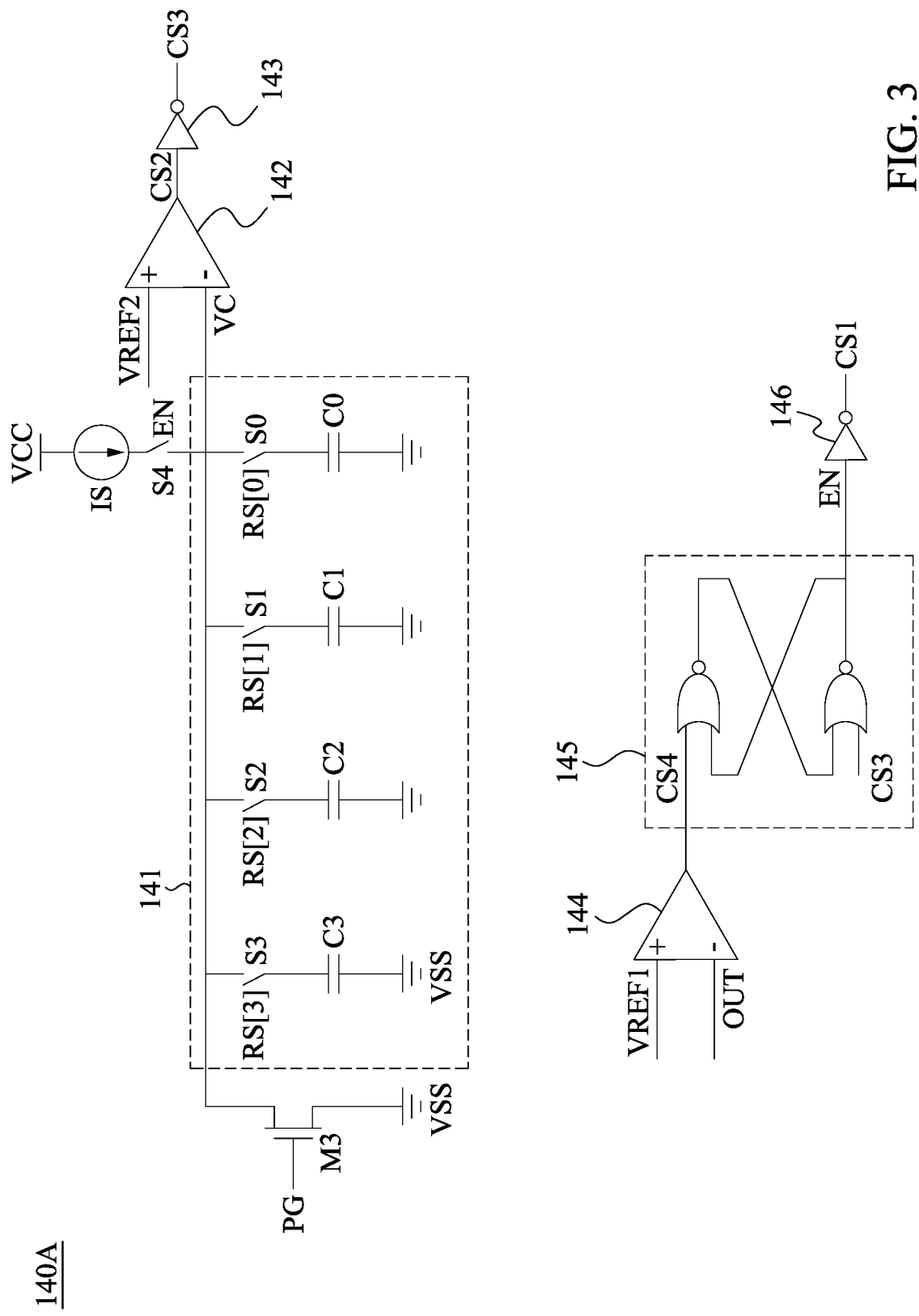
FIG. 3 is a circuit diagram illustrating a control circuit according to some embodiments of the present disclosure.

Reference is made to FIG. 3. FIG. 3 is circuit diagram illustrating a control circuit 140A according to some embodiments of the present disclosure. In some embodiments, the control circuit 140A is applied to the control circuit 140 in FIG. 1, but the present disclosure is not limited thereto. In some embodiments, the control circuit 140A operates according to the random number sequence RS[3:0] in FIG. 2A, FIG. 2B, FIG. 2C, and FIG. 2D.

As illustrated in FIG. 3, the control circuit 140A includes a transistor M3, a switched capacitor circuit 141, a switch S4, a comparator 142, an inverter 143, a comparator 144, a flip flop 145, and an inverter 146. In this example, the transistor M3 and the switch S4 may be implemented by N-type transistors.

The switched capacitor circuit 141 is configured to generate a charge signal VC according to the random number sequence RS[3:0] in FIG. 2A, FIG. 2B, FIG. 2C, or FIG. 2D. In specific, the switched capacitor switch circuit 141 includes capacitors C0-C3 and switches S0-S3. The switches S0-S3 are coupled in series to the capacitors C0-C3 respectively. The switches S0-S3 are controlled by bits RS[0]-RS[3] of the random number sequence RS[3:0] respectively to be turned on or to be turned off. The switched capacitor circuit 141 is coupled to the transistor M3. The transistor M3 is coupled to the ground voltage VSS and is controlled by the driving signal PG to be turned on or turned off. The switched capacitor circuit 141 receives a current supplied from a current source IS through the switch S4. The switch S4 is controlled by the enable signal EN to be turned on or turned off. The switched capacitor circuit 141 works in coordination with the switch S4 and the transistor M3 to generate the charge signal VC. In some embodiments, capacitance values of the capacitors C0-C3 are different. For example, the capacitor C3 has one unit of capacitance value, the capacitor C2 has two units of capacitance value, the capacitor C1 has four units of capacitance value, and the capacitor C0 has eight units of capacitance value. Accordingly, since switches S0-S3 are controlled by the bits RS[0]-RS[3] of the random number sequence RS[3:0] respectively to be turned on or to be turned off, and the capacitance values of the capacitors C0-C3 are different, the charge speed (slop) of the charge signal VC (as the charge signal VC in FIG. 4) are varied.

The comparator 142 is configured to compare the charge signal VC and a reference signal VREF2 to generate a control signal CS2. The inverter 143 is configured to generate an inverted signal (a control signal CS3) of the control signal CS2. The comparator 144 is configured to compare the reference signal VREF1 and the power signal OUT to generate a control signal CS4. The flip flop 145 is configured to generate an enable signal EN according to the control signal CS4 and the control signal CS3. The inverter 146 is configured to generate an inverted signal (the control signal CS1) of the enable signal EN.

Figure 4:
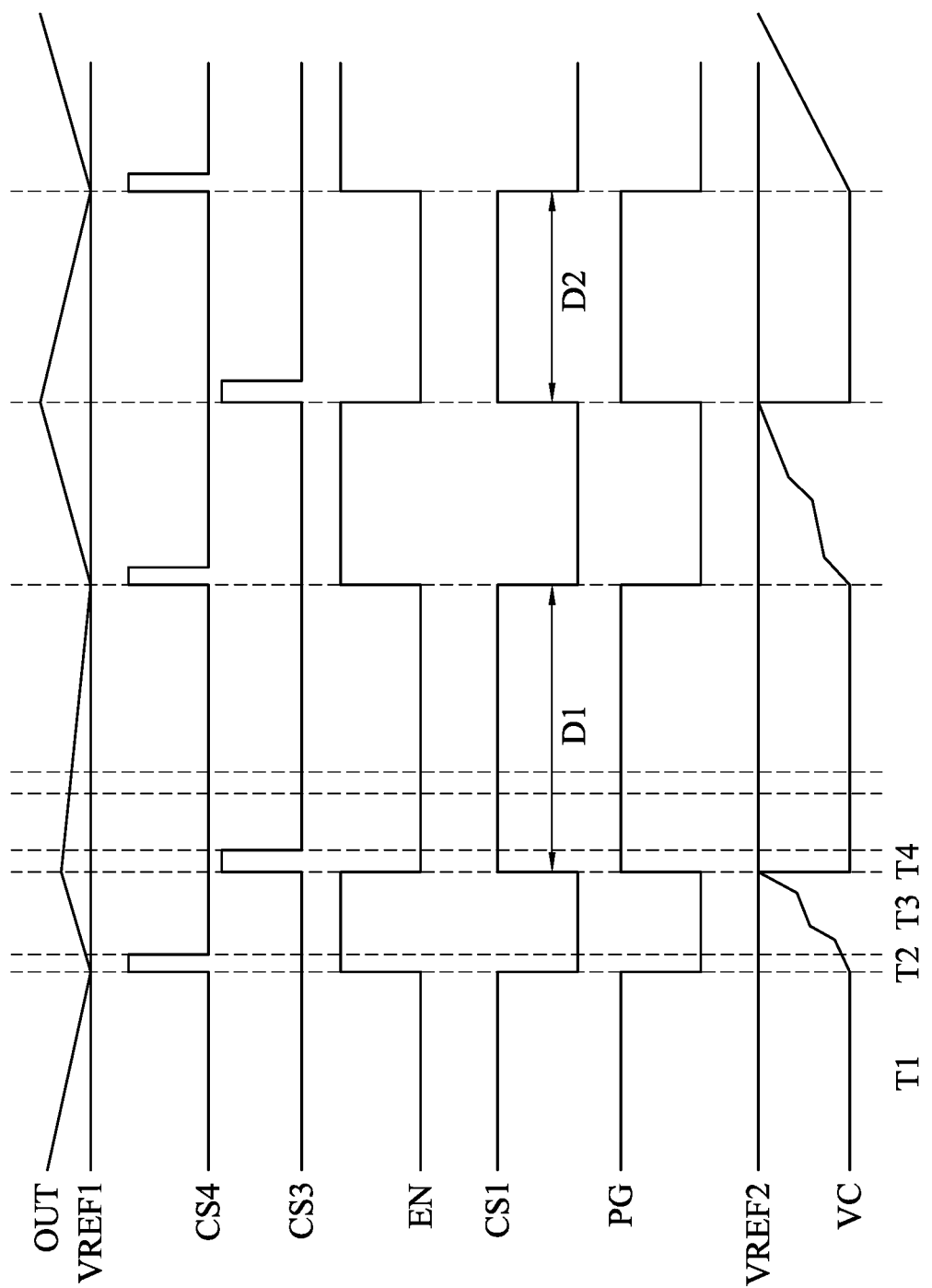
FIG. 4 is a waveform diagram illustrating signals of the control circuit in FIG. 3 according to some embodiments of the present disclosure.

Reference is made to FIG. 4. FIG. 4 is waveform diagram illustrating signals of the control circuit 140A in FIG. 3 according to some embodiments of the present disclosure. For ease of understanding, FIG. 4 is discussed with FIG. 1 and FIG. 3.

In a time duration T1, the power signal OUT is decreased gradually, but still larger than the reference signal VREF1. In this situation the control signal CS4 outputted from the comparator 144 has a low voltage level.

In a time duration T2, when the power signal OUT is smaller than the reference signal VREF1, the control signal CS4 outputted by the comparator 144 is turned into a high voltage level. The control signal CS4 changes from the low voltage level to the high voltage level, the control signal CS3 has a low voltage level, and the enable signal EN outputted by the flip flop 145 has a high voltage level. Accordingly, the switch S4 in FIG. 3 is turned on, and the control signal CS1 outputted by the inverter 146 has a low voltage level. In this situation, the driving signal PG and the driving signal NG also have a low voltage level. Accordingly, the transistor M1 in FIG. 1 is turned on, and the transistor M2 in FIG. 1 and the transistor M3 in FIG. 3 are turned off. In this situation, the voltage level at the node LX in FIG. 1 is pulled up by the power voltage VDD through the transistor M1, such that the voltage level of the power signal OUT is pulled up. At the same time, the current source IS in FIG. 3 charges the switched capacitor circuit 141 through the switch S4, and the current does not flow to ground through the transistor M3, to pull up a voltage level of the charge signal VC.

In a time duration T3, when the power signal OUT is larger than the reference signal VREF1, the control signal CS4 outputted by the comparator 144 is turned into a low voltage level. Since the control signal CS4 changes from the high voltage level to the low voltage level, and the control signal CS3 has the low voltage level, the enable signal EN outputted by the flip flop 145 still has the high voltage level. Accordingly, the switch S4 in FIG. 3 is turned on, and the control signal CS1 outputted by the inverter 146 has a low voltage level. In this situation, the driving signal PG and the driving signal NG also have a low voltage level. Accordingly, the transistor M1 in FIG. 1 turned on, and the transistor M2 in FIG. 1 and the transistor M3 in FIG. 3 are turned off. In this situation, the voltage level at the node LX in FIG. 1 is pulled up by the power voltage VDD through the transistor M1, such that the voltage level of the power signal OUT is pulled up. At the same time, the current source IS in FIG. 3 charges the switched capacitor circuit 141 through the switch S4 and the current does not flow to ground through the transistor M3, to pull up the voltage level of the charge signal VC.

In a time duration T4, when the charge signal VC is larger than the reference signal VREF2, the control signal CS2 outputted by the comparator 142 has a low voltage level. Accordingly, the control signal CS3 outputted by the inverter 143 is turned into a high voltage level. Since the control signal CS4 has the low voltage level, and the control signal CS3 changes from the low voltage level to the high voltage level, the enable signal EN outputted by the flip flop 145 has a low voltage level. Accordingly, the switch S4 in FIG. 3 is turned off and the control signal CS1 outputted by the inverter 146 has a high voltage level. In this situation, the driving signal PG and the driving signal NG also have a high voltage level. Accordingly, the transistor M1 in FIG. 1 is turned off, and the transistor M2 in FIG. 1 and the transistor M3 in FIG. 3 are turned on. In this situation, the voltage level at the node LX in FIG. 1 is pulled down by the ground voltage VSS through the transistor M2, such that the voltage level of the power signal OUT is pulled down. At the same time, the voltage level of the charge signal VC in FIG. 3 is pulled down by the ground voltage VSS through the transistor M3.

In addition, references are made to FIG. 1 and FIG. 4. Since the power signal OUT is pulled down through the inductor L01 and the transistor M2, and a capacitance value of the capacitor C01 is larger (for example: 4.7 uF), the power signal OUT is pulled down slowly. The charge signal VC is pulled down merely through the transistor M3, and the capacitance values of the capacitors C0-C3 are smaller (for example, less than 100 pF), so the charge signal VC is pulled down rapidly.

As described above, charging speeds of the charge signal VC generated based on the random number sequence RS[3:0] are varied. Accordingly, the duty cycles of the control signal CS1 generated based on the charge signal VC are not fixed. As illustrated in FIG. 4, a duty cycle D1 of the control signal CS1 is longer, and a duty cycle D2 of the control signal CS1 is shorter. Thus, the spectrum of the power signal OUT outputted by the power circuit 160 is spread.

Figure 5:
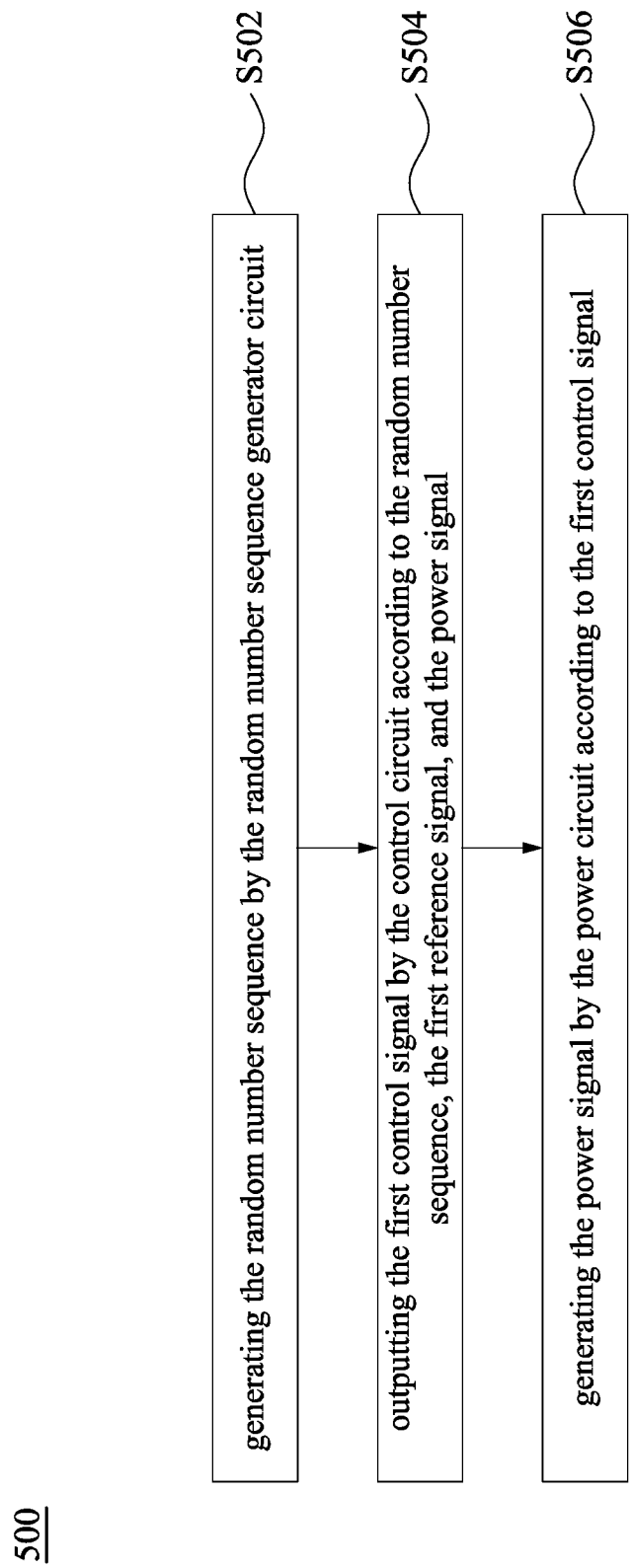
FIG. 5 is a flow diagram illustrating an operation method of a power supplier circuit according to some embodiments of the present disclosure.

Reference is made to FIG. 5. FIG. 5 is a flow diagram illustrating an operation method 500 of a power supplier circuit according to some embodiments of the present disclosure. The operation method 500 includes an operation S502, an operation S504, and an operation S506. In some embodiments, the operation method 500 is applied to the power supplier circuit 100 in FIG. 1, but the present disclosure is not limited thereto. For ease of understanding, the operation method 500 is discussed with FIG. 1.

In the operation S502, the random number sequence generator circuit 120 generates the random number sequence RS[3:0]. A quantity of the bits of the random number sequence RS[3:0] is only for illustration, various quantities are with scopes of the present disclosure.

In the operation S504, the control circuit 140 outputs the control signal CS1 according to the random number sequence RS[3:0], the reference signal VREF1, and the power signal OUT. Accordingly, the duty cycles of the control signal CS1 are response to the random number sequence RS[3:0].

In the operation S506, the power circuit 160 generates the power signal OUT according to the control signal CS1. As described above, the duty cycles of the control signal CS1 are response to the random number sequence RS[3:0]. Accordingly, the duty cycles of the power signal OUT generated according to the control signal CS1 are also in response to the random number sequence RS[3:0] In this situation, the duty cycles of the power signal OUT are not fixed, such that the spectrum of the power signal OUT is spread.

As the above embodiments, the power supplier circuit and the operation method of the present disclosure can reduce discomfort to ears of people resulted from the power signal of the audio apparatus.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuity in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A power supplier circuit configured to supply a power signal to a codec of an audio apparatus, wherein the power supplier circuit comprises:
   a random number sequence generator circuit configured to generate a random number sequence;
   a control circuit configured to receive the power signal and output a first control signal according to the random number sequence, a first reference signal, and the received power signal; and
   a power circuit configured to generate the power signal according to the first control signal, such that a spectrum of the power signal is spread in response to the random number sequence.

2. The power supplier circuit of claim 1, wherein a first duty cycle of the first control signal is different from a second duty cycle of the first control signal.

3. The power supplier circuit of claim 1, wherein the random number sequence generator circuit comprises:
   a Pseudo Randomness Binary Sequence (PRBS) generator configured to generate a PRBS sequence according to a first clock signal, to be the random number sequence.

4. The power supplier circuit of claim 1, wherein the random number sequence generator circuit comprises:
   a Pseudo Randomness Binary Sequence (PRBS) generator configured to generate a PRBS sequence according to a first clock signal; and
   a processor, based on a look-up table, configured to generate a redistribution signal according to the first clock signal and the PRBS sequence, to generate the random number sequence.

5. The power supplier circuit of claim 4, wherein the random number sequence generator circuit further comprises:

a frequency divider configured to divide a frequency of a second clock signal, to generate the first clock signal.

6. The power supplier circuit of claim 4, wherein the random number sequence generator circuit further comprises:
   a filter configured to perform a filtering process to the redistribution signal according to the first clock signal, to generate the random number sequence.

7. The power supplier circuit of claim 1, wherein the random number sequence generator circuit comprises:
   a triangle wave generator configured to generate a triangle wave signal according to a first clock signal; and
   a processor, based on a look-up table, configured to generate the random number sequence according to the first clock signal and the triangle wave signal.

8. The power supplier circuit of claim 1, wherein the control circuit comprises:
   a switched capacitor circuit configured to generate a charge signal according to the random number sequence;
   a first comparator configured to compare the charge signal and a second reference signal to generate a second control signal;
   a first inverter configured to generate a third control signal according to the second control signal;
   a second comparator configured to compare the first reference signal and the power signal to generate a fourth control signal;
   a flip flop configured to generate an enable signal to according to the fourth control signal and the third control signal; and
   a second inverter configured to generate the first control signal according to the enable signal, wherein duty cycles of the first control signal are in response to the random number sequence.

9. The power supplier circuit of claim 8, wherein the switched capacitor circuit comprises:
   a plurality of capacitors; and
   a plurality of switches, coupled in series to the capacitors respectively, wherein the switches are configured to be tuned on or off respectively according to a plurality of bits of the random number sequence, to generate the charge signal.

10. The power supplier circuit of claim 9, wherein capacitance values of the capacitors are different.

11. An operation method of a power supplier circuit, wherein the power supplier circuit is configured to supply a power signal to a codec of an audio apparatus, wherein the operation method comprises:
   generating a random number sequence by a random number sequence generator circuit;
   receiving the power signal and outputting a first control signal according to the random number sequence by a control circuit, a first reference signal, and the received power signal; and
   generating the power signal according to the first control signal by a power circuit, such that a spectrum of the power signal is spread in response to the random number sequence.

12. The operation method of claim 11, wherein a first duty cycle of the first control signal is different from a second duty cycle of the first control signal.

13. The operation method of claim 11, wherein generating the random number sequence comprises:
   generating a Pseudo Randomness Binary Sequence (PRBS) sequence according to a first clock signal by a PRBS generator, to be the random number sequence.

14. The operation method of claim 11, wherein generating the random number sequence comprises:
   generating a Pseudo Randomness Binary Sequence (PRBS) sequence according to a first clock signal by a PRBS generator; and
   generating, based on a look-up table, a redistribution signal according to the first clock signal and the PRBS sequence by a processor, to generate the random number sequence.

15. The operation method of claim 14, further comprising:
   performing a filtering process to the redistribution signal according to the first clock signal by a filter, to generate the random number sequence.

16. The operation method of claim 11, wherein generating the random number sequence comprises:
   generating a triangle wave signal according to a first clock signal by a triangle wave generator; and
   generating, based on a look-up table, the random number sequence according to the first clock signal and the triangle wave signal by a processor.

17. The operation method of claim 11, wherein generating the first control signal comprises:
   generating a charge signal according to the random number sequence by a switched capacitor circuit;
   comparing the charge signal and a second reference signal by a first comparator to generate a second control signal;
   generating a third control signal according to the second control signal by a first inverter;
   comparing the first reference signal and the power signal by a second comparator to generate a fourth control signal;
   generating an enable signal to according to the fourth control signal and the third control signal by a flip flop; and
   generating the first control signal according to the enable signal by a second inverter, wherein duty cycles of the first control signal are in response to the random number sequence.

18. The operation method of claim 17, wherein the switched capacitor circuit comprises a plurality of capacitors, wherein capacitance values of the capacitors are different.

* * * * *